United States Patent
Male

(10) Patent No.: US 7,855,432 B2
(45) Date of Patent: Dec. 21, 2010

(54) INTEGRATED THERMAL CHARACTERIZATION AND TRIM OF POLYSILICON RESISTIVE ELEMENTS

(75) Inventor: Barry Jon Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 1121 days.

(21) Appl. No.: 11/527,371

(22) Filed: Sep. 26, 2006

(65) Prior Publication Data

US 2007/0075398 A1 Apr. 5, 2007

Related U.S. Application Data

(60) Provisional application No. 60/722,279, filed on Sep. 30, 2005.

(51) Int. Cl.
H01L 29/00 (2006.01)
(52) U.S. Cl. .................. 257/536; 338/195
(58) Field of Classification Search .......... 257/536; 323/353; 338/195
See application file for complete search history.

(56) References Cited

U.S. PATENT DOCUMENTS

| | | | | |
|---|---|---|---|---|
| 4,210,996 | A | 7/1980 | Amemiya et al. | 29/610 R |
| 5,466,484 | A * | 11/1995 | Spraggins et al. | 438/385 |
| 7,119,656 | B2 * | 10/2006 | Landsberger et al. | 338/195 |
| 2003/0006478 | A1 * | 1/2003 | Clevenger et al. | 257/528 |

OTHER PUBLICATIONS

J.A. Babcock, Member, IEEE, et al., "Precision Electrical Trimming of Very Low TCR Poly-SiGe Resistors", IEEE Electron Device Letters, vol. 21, No. 6, Jun. 2000, pp. 283-285.

* cited by examiner

Primary Examiner—Lex Malsawma
(74) Attorney, Agent, or Firm—John J. Patti; Wade J. Brady III; Frederick J. Telecky, Jr

(57) ABSTRACT

Devices, systems, and methods for providing an on-chip, temperature-stable resistance network for generating a precision current or precision resistance are disclosed. The resistance network includes a first resistance material having a linear, negative temperature coefficient of resistance and a second resistance material having a linear, positive temperature resistance. The first and second resistance materials are arrayed in segments proximate to a local, pulsed thermal gradient and are combined or mixed, i.e., trimmed, to provide a zero or near zero thermal coefficient.

16 Claims, 4 Drawing Sheets

INTEGRATED THERMAL CHARACTERIZATION AND TRIM OF POLYSILICON RESISTIVE ELEMENTS

CROSS-REFERENCE TO RELATED APPLICATIONS

This application claims the benefit of U.S. provisional patent application No. 60/722,279 filed on Sep. 30, 2005, which is incorporated herein in its entirety by reference.

TECHNICAL FIELD

The present invention relates to trimming polysilicon resistive elements and, more particularly, to trimming polysilicon resistive elements by adjusting the "resistive mixture" of plural polysilicon segments having uniform or linear thermal coefficients of resistance of opposite signs.

BACKGROUND

Integrated circuits (IC), especially analog integrated circuits, need precise, temperature-stable voltage and/or current sources that are processed independently. Traditionally, very precise voltage sources can be produced, e.g., using bandpass or buried Zener circuitry. However, precise current sources that exhibit both process stability and temperature stability are more difficult to manufacture on-chip partially due to the lack of precision resistive components in most IC processing.

Available resistive components used in conventional IC processing have very large temperature coefficients, e.g., measured in the 1000's of ppm/° C., and large process tolerances, e.g., ±30 percent. Accordingly, heretofore, ICs requiring a precision current source have had to rely on external, i.e., off-chip, reference resistance in combination with on-chip voltage reference.

Existing methods of providing precise, on-chip current sources rely on either using a very accurate, resistive material, e.g., thin films of chromium-based metals, and/or combining lower-accuracy solid-state devices in such a way as to provide a final device with a high-degree of accuracy, which is to say, with a low temperature coefficient (TC) and a tight tolerance.

Establishing a process with a very accurate, resistive material, however, requires additional, expensive processing, typically involving additional process masks and fabrication steps. Combining lower-accuracy devices to produce a higher-accuracy device requires testing due to the electrical characteristics of the opposing TC poly-materials, which do not necessarily track each other due to manufacturing tolerances, and, further, requires trimming of the silicon wafer or the resulting, packaged device at multiple temperatures.

Combining or mixing positive TC current sources and negative TC current sources to provide a zero or near-zero TC current source is known in the art. However, verification of the proper "resistance mixture" to achieve the desired zero or near-zero TC mix without having to trim any "over temperature" remains problematic.

Therefore, it would be desirable to provide devices and systems that use readily-available, lower-accuracy solid-state components and standard IC processes to provide a repeatable, precision, zero or near-zero TC, poly-silicon resistance network that provides an optimal "resistance mixture" of opposing TC poly-materials without requiring undue "over temperature" trimming. More particularly, it would be desirable to combine or to mix opposing TC poly-materials having uniform/linear temperature coefficients of resistance and identical thermal mass and thermal conductivity properties.

It would be further desirable to include the devices on-chip as current sources for any IC requiring a precision resistance or a precision current. More specifically, it would be desirable to provide a precision current source to enable power over the Ethernet applications.

SUMMARY

An on-chip, temperature-stable resistance network for generating a precision current or a precision resistance is disclosed. The resistance network includes a first resistance material, e.g., a high-sheet rho poly-silicon resistance material, arrayed in a first plurality of segments on the chip and a second resistance material, e.g., a medium-sheet rho poly-silicon resistance material, arrayed in a second plurality of segments on the chip. The temperature coefficient of resistance of the second resistance material and the temperature coefficient of resistance (TCR) of the first resistance material have opposite signs so that, when combined in the network, the opposing TCRs produce a net resistance variation of zero as the network's overall temperature changes. In addition, this resistance network is constructed in such a way as to respond to only the average value of either external or local, linear thermal gradients.

In one aspect of the resistance network, a resistive heater element, e.g., a metal heater coil, provides a local thermal gradient to the resistance network. The resistive heater element is disposed directly above or directly below the resistance network to promote thermal coupling. Thermal coupling provides a fast thermal response time, e.g., less than about 100 microseconds, between about 20 microseconds and about 50 microseconds, to resistance network value changes. The resistive heater element is energized and the pulse amplitude is controlled, to provide a uniform and symmetrical thermal gradient, e.g., a local temperature between about 30 degrees Centigrade and about 60 degrees Centigrade above the average temperature of the chip.

Optionally, a shield, e.g., a metal, grounded or electrically-driven Faraday shield, can be interposed between the resistive heater element and the network to reduce capacitive coupling and to increase thermal uniformity across the resistance network surface. This shield can be grounded or electrically-driven to a static or dynamic potential.

A circuit for providing a precision current source is also disclosed. The circuit includes a temperature-stable resistance network; a resistive heater element for providing a local thermal gradient; a trim controller for changing the temperature coefficient of resistance of the resistance network; and an absolute (or overall) trim controller for changing the temperature coefficient of resistance of the resistance network without altering the precision current circuit's overall temperature coefficient.

In one aspect of the precision current source, the circuit includes a mixture trim controller, e.g., a four-bit trim controller such as a current mirror and a current splitter. The mixture trim controller changes or adjusts the absolute (or overall) TCR of the resistance network to zero or near-zero. More specifically, the mixture trim controller varies or adjusts the number of first resistance material segments and the number of second resistance material segments in the "resistive mixture" of the resistance network so that the TCR of the resistance network is zero or near-zero. The mixture trim controller controls the TCR of the resistance network and the resulting overall TCR of the precision current circuit's current.

In yet another aspect of the precision current source, the precision current source also includes an absolute (or overall)

trim controller for changing the output current. The absolute (or overall) trim controller trims the output current without altering the overall TCR.

A method of providing a precision current source or of providing a precision resistance on-chip to an integrated circuit is also disclosed. The method includes providing an on-chip resistance network that includes a first resistance material arrayed in a first plurality of segments and a second resistance material arrayed in a second plurality of segments; determining initial current and resistance properties of each resistance material of the first and second plurality of segments; applying a local thermal gradient to the resistance network; adjusting an overall TCR of the resistance network by adjusting the number of first resistance material segments and the number of second resistance material segments in a "resistance mixture"; and adjusting the output current by trimming the applied voltage to the resistance network.

Adjusting the overall TCR of the resistance network includes determining post-energizing current and resistance properties of each resistance material of the first and second plurality of segments; comparing initial current values with post-energizing current values; and adjusting the number of first and second resistance material segments in the "resistance mixture".

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
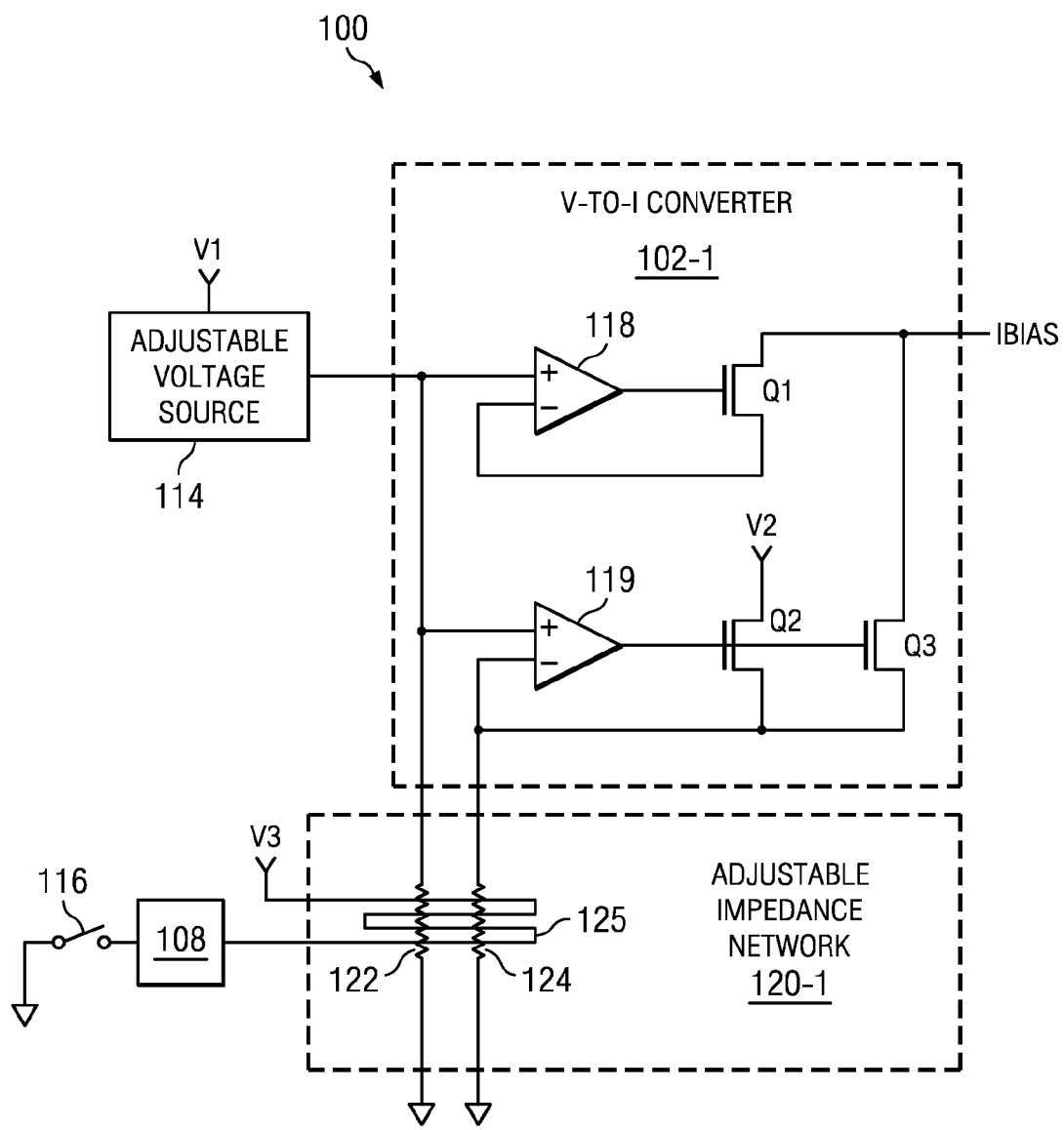
FIGS. 1A and 1B are examples of circuits in accordance with the present invention.

Refer now to the drawings wherein depicted elements are, for the sake of clarity, not necessarily shown to scale and wherein like or similar elements are designated by the same reference numeral through the several views.

Here, devices, systems, and methods are described for providing an on-chip, zero or near-zero temperature coefficient of resistance (TCR) resistor or a zero or near-zero temperature coefficient current source, or current reference. The disclosed devices, systems, and methods combine or mix an array of resistive materials having positive temperature coefficients of resistive with an array of resistance materials having negative, i.e., opposing, TCR so that, when combined in a resistance network, e.g., in a "resistance mixture", the TCR with opposing signs, i.e., the "opposing TCRs", cancel one another. More specifically, the present invention describes an on-chip, temperature-stable, resistance network for generating a precision current or a precision reference circuit.

Referring to FIG. 1A, an example circuit 100 that provides a high-precision, on-chip, bias current IBIAS in accordance with the present invention can be seen. Circuit 100 generally comprises resistance or impedance network 120-1 a voltage-to-current converter 102-1, an adjustable voltage source 114, a pad 108, and a switch 116. The impedance network 120-1 generally comprises a heating element or serpentine heater resistor 125, and resistor networks 1202 and 1204. The voltage-to-current or V-to-I converter 102-1 generally comprises differential amplifiers 118 and 119 and transistors Q1 through Q3.

Figure 1B:
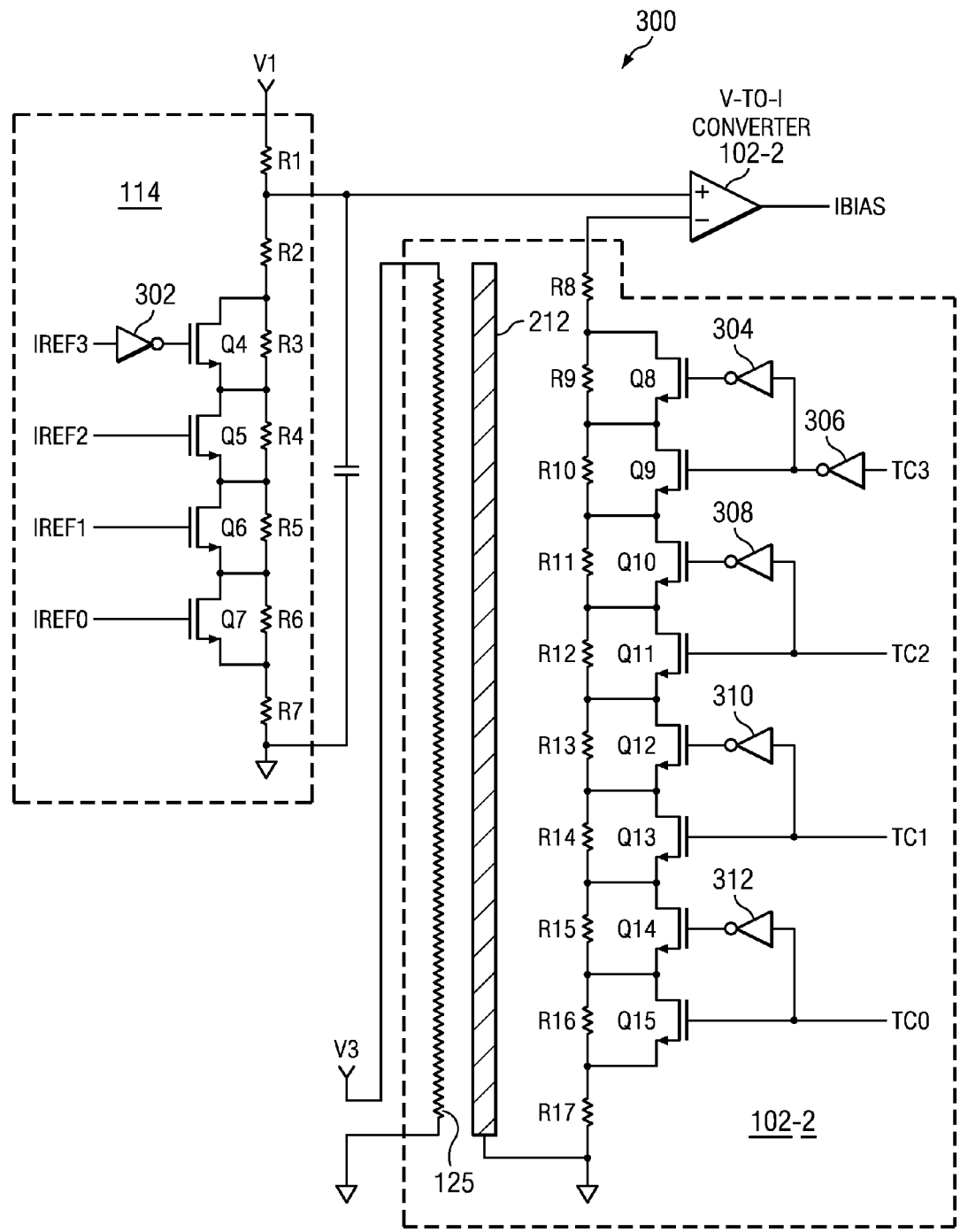

In operation, adjustable voltage source 114 receives a voltage V1 (which is typically about 2.5V) so as to provide absolute (or overall) resistance trim control. Generally, adjustable voltage source 114 provides a voltage to differential amplifier 118 so that transistor is able to generate the bias current IBIAS. "Resistance mixture" trim control is generally provided through differential amplifier 119, transistors Q2 (which receives voltage V2 that is about 10V), and transistor Q3. The negative input terminals of differential amplifiers 119 and 119 are coupled to resistor networks 1202 and 1204, which comprise different resistance materials. Serpentine heater resistor 125 receives voltage V3, which is about 48V so as to locally heat resistor networks 1202 and 1204. Switch 116 is closed to cause the resistor 125 to heat resistor networks 1202 and 1204, and pad 108 is generally Referring to FIG. 1B of the drawings, the reference numeral 300 generally designates an example of circuit in accordance with a preferred embodiment of the present invention. Circuit 300 generally comprises adjustable voltage source 114 (which is shown in greater detail), voltage-to-current converter 102-2, and impedance network 120-2.

The adjustable voltage source 114 operates to provide a voltage to the voltage-to-current converter 102-2. Source 114 is generally comprised of reference resistors R1 through R7 coupled in series with one another between voltage V1 (which is generally about 2.5V) and ground. Reference NMOS transistors Q4 through Q7 are coupled across resistors R3 through R6, respectively. Additionally, inverter 302 is coupled to the gate of transistor Q4. The resistance (and voltage output to converter 102-2) is varied or adjusted based on the reference signals IREF0 through IREF3.

The adjustable impedance network 120-2 provides a impedance or resistance to the negative input terminal of converter 102-2. Network 120-2 generally comprises serpentine heater resistor 125, faraday shield 212 (which is grounded), resistors R8 and R17, and several trim sets coupled in series with one another. Each trim set is generally comprised of a pair of trim resistors R9/R10, R11/R12, R13/R14, and R15/R16 coupled in series with one another, a pair of NMOS trim transistors Q8/Q9, Q10/Q11, Q12/Q13, and Q14/Q15 that are each coupled across one of resistors R9 through R16, and inverters 304, 308, 310, and 312. Additionally, the gate of transistor Q9 and inverter 304 are coupled to inverter 306. In operation, trim signals are provided TC0 through TC3 are provided to vary the impedance. Additionally, each resistor R9, R11, R13, R15 are made of a first material, while resistors R10, R12, R14, and R16 are made of a second material.

Figure 2A:
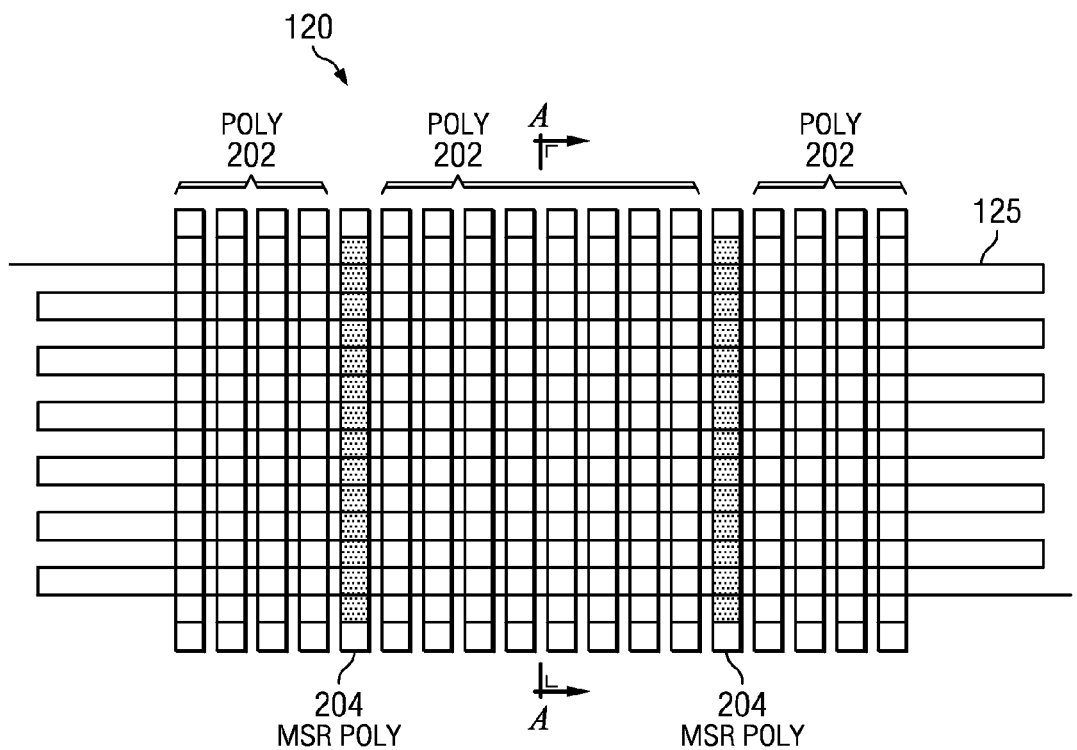
FIGS. 2A and 2B are examples of the adjustable impedance networks of FIGS. 1A and 1B.
Figure 2B:
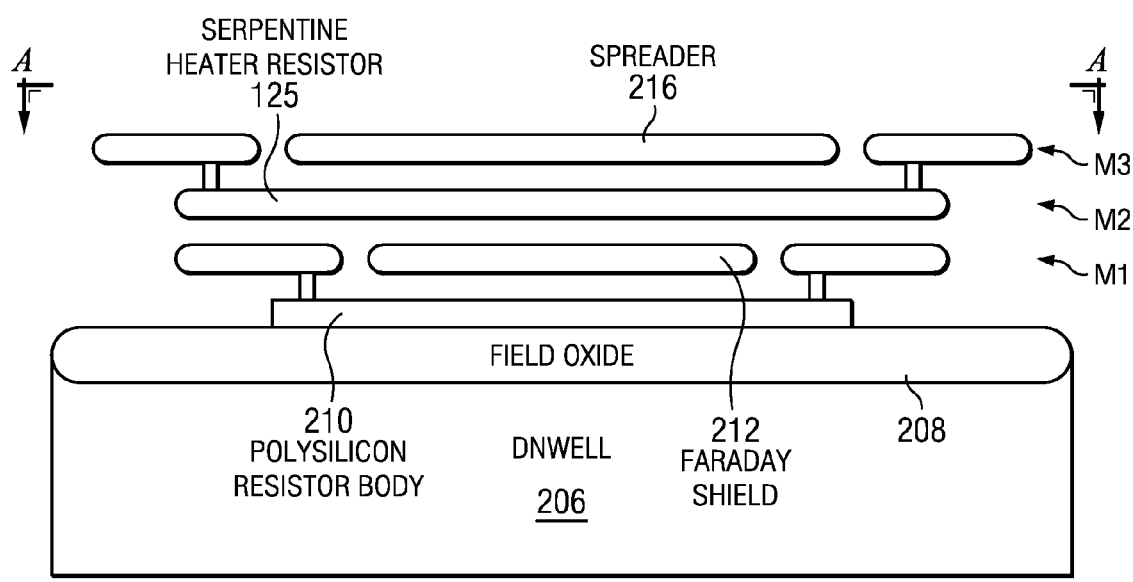

As shown in FIGS. 2A and 2B, the temperature-stable, resistance or impedance network 120 (which can be either impedance network 120-1 or 120-2, but is referred to as 120 for the sake of simplicity) includes a first resistance material 202 that is arrayed in a first plurality of segments and a second resistance material 204 that is arrayed in a second plurality of segments. The arrangement shown in FIG. 2 corresponds to a common centroid configuration, however, this arrangement is shown illustratively and is not to be construed as limiting. The first and second resistance materials 202 and 204 can be polysilicon resistors and the like. Although polysilicon resistors generally have poor TCRS and poor absolute thickness tolerances, doping levels of the polysilicon resistors can be structured and arranged to produce suitable MSR and HSR polysilicon resistors 204 and 202. Advantageously, polysilicon resistors have extremely uniform or linear TCRs. Furthermore, polysilicon resistors have small extraneous parasitics residing in the dielectric layers that are disposed above the bulk silicon.

As an example, one of the resistance materials in the resistance network 20, e.g., the first resistance material 202, is a high-sheet rho (HSR) poly-silicon resistor and the other resistance material in the resistance network 20, e.g., the second resistance material 204, is a medium-sheet rho (MSR) poly-silicon resistor. MSR polysilicon resistors 204 and HSR poly-silicon resistors 202 have identical or substantially identical thermal properties, such as thermal mass, thermal resistance, and thermal conductivity, but have positive TCRs and negative TCRs, respectively. For example, when an MSR polysilicon resistor 204 is heated, resistance increases uniformly or linearly at about +800 ppm/° C. In contrast, when an HSR polysilicon resistor 202 is heated, resistance decreases uniformly or linearly at about −400 ppm/° C. Advantageously, the combination or mixture of positive TCR, MSR poly-silicon resistors 204 and negative TCR, HSR poly-silicon resistors 202 in the resistance network 120 can be adjusted continuously to provide a zero or near-zero overall network temperature coefficient of resistance. Moreover, the first resistance material 202 and the second resistance material 204 can also be structured and arranged to negate external thermal gradient effects when exposed to a local thermal gradient.

Generally, as can be seen in FIG. 2B, polysilicon resistors 202 and 204 are formed within polysilicon resistor body 210. This resistor body 212 is formed over a field oxide layer 208 and DNWell 206. Above the resistor body 212, three metallization layers M1, M2, and M3 are formed. Metallization layer M1 includes a Faraday shield 212. Metallization layer M2 includes the serpentine heater resistor 125, and metallization layer M3 includes heat spreader 216.

The local thermal gradient is provided by a resistive heater element or serpentine heater resistor 125 or thermal gradient generator, e.g., an array of one or more heater coils. The resistive heater element 125 can be manufactured of a lightweight, electrically-conductive metal, e.g., aluminum and aluminum alloys. The resistive heater element 125 is disposed directly above the MSR polysilicon resistors 204 and HSR poly-silicon resistors 202 in the resistance network 120 (or, alternatively, directly below the resistance network 20, if the substrate or die is inverted). Disposing the resistive heater element 125 directly above (or directly below) the resistance network 120 promotes better thermal coupling while, importantly, confining the heating element 125 to a small percentage of the overall circuit area so that just the resistance network 120 is heated. Very tight thermal coupling ensures a uniform and symmetrical thermal gradient on both the negative TCR portion 202 and the positive TCR portion 204 of the resistance network 120. Thermal coupling also allows fast, first-order thermal response time constants in the range between about 20 and about 50 microseconds (μsec). As a result, the settling time is less than about 100 μsec, which does not significantly impact testing and trimming time. Desirably, once the resistive heater element 25 is energized, the local temperature of the resistance network 120 is between about 30° C. and about 60° C. above the average temperature of the bulk silicon substrate or die. More desirably, the average temperature of the bulk silicon substrate or die remains relatively unchanged throughout the energizing phase while the resistance network 120 is heated.

Alternatively, the resistive heater element 125 can be energized quickly, e.g., using a voltage jump from 0V to about 48V, producing a thermal pulse. Energizing the resistive heater element 125 provides an abrupt change in temperature (ΔT) of the resistance materials 202 and 204 in the resistance network 120 of about 40° C. Temperature is generally set by the pulse amplitude. Thus, the ΔT is more critical that the absolute temperature ($T_{max}$) because the intent is to provide a repeatable temperature "look ahead" signal from which the mixture trim controller (such as differential amplifier 119 and transistors Q2 and Q3) can adjust the "resistance mixture" of first and second resistance materials segments 202 and 204 to achieve a zero or near-zero TCR.

A mixture trim controller, e.g., a four-bit controller such as a current splitter, a current minor, and the like, adjusts and controls the "resistance mixture" of the resistance network 120 to provide the lowest, i.e., a zero or near-zero, TCR. More specifically, the mixture trim controller extrapolates the optimal combination or mixture of first resistance material segments 202 and second resistance material segments 204 that, in a discrete combination or "resistance mixture", provide a zero or near-zero TCR.

For example, the mixture trim controller uses known TCR data for each of the various resistance materials segments 202 and 204 and, further, samples the change in temperature (ΔT) after the resistive heater 125 is energized. By energizing the resistive heater element 125 quickly and heating the resistance network 120 abruptly, the overall TCR of the resistance network 120 and the TCRs of resistance material segments 202 and 204 can be measured quickly at various temperatures. Using these data, the mixture trim controller 12 can extrapolate or forecast an optimal resistance network 20 arrangement consistent therewith. The mixture trim controller changes the overall TCR of the resistance network 20 by adding or deleting the number of the first resistance material segments 202 and the number of second resistance material segments 204 comprising the resistance network 120.

More specifically, the mixture trim controller proportionally "trims" the number of segments or groups of the negative temperature coefficient elements 202 and the number of segments or groups of positive temperature coefficient elements 204 in the "resistance mixture" by measuring the output current from the resistance network 120 before and after energizing the resistive heater element 25. Advantageously, the mixture trim controller changes the overall TCR of the resistance network 120 albeit without altering the circuit's (circuit 100, for example absolute (or overall) resistance value. To that end, the mixture trim controller can include or be in operational association with a standard fuse, a poly-fuse bus, an EE bus, and the like.

Optionally, a heat spreader 212, e.g., a grounded, metal or an electrically-driven Faraday shield, can be interposed between the resistive heater element 125 and the resistance network 120. The heat spreader 212 reduces capacitive coupling therebetween and increases thermal uniformity across the network 120 surface. The Faraday shield 212 electrically shields the resistance network 120 from the switching noise that resides on the heater element 125 while the heater coil of the resistive heater element 125 is being energized.

Figure 3:
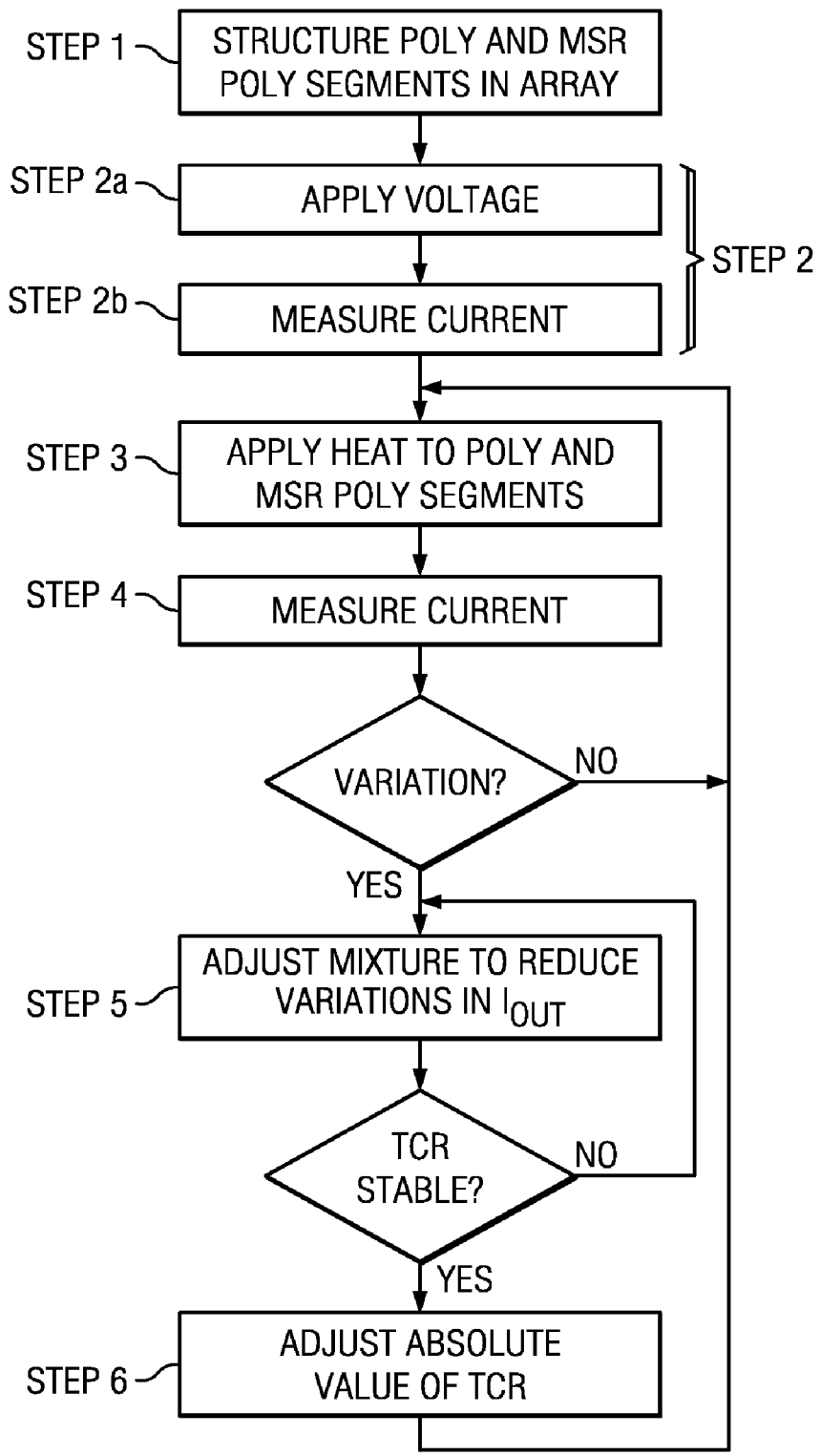
FIG. 3 is an example of a flow chart depicting a method of providing a zero or near-zero temperature coefficient precision current source in accordance with the present invention.

Having described a resistance network 120 and circuits 100 and 300 using the resistance network 120-1 and 120-2 to provide a precision, on-chip current source, or current reference, a method of providing on-chip, precision current will be described. Referring to FIG. 3, there is shown a flow diagram for providing the same.

In a first step, a resistance network is provided on the chip (STEP 1). In one aspect of the invention, the resistance network includes a first resistance material arrayed in a first plurality of segments, and a second resistance material arrayed in a second plurality of segments such as described above. The first and second resistance materials have the same or substantially the same thermal mass and thermal resistance properties. However, the second resistance material has a temperature coefficient of resistance (TCR) opposite in sign as that of the first resistance material. To maintain uniform thermal resistance, the end contacts of each of the first and the second plurality of segments are interconnected.

In a second step, an identical voltage can be applied across each of the segments of the first and the second resistance material (STEP 2a) and output currents can be measured or sampled for each segment or any of a plurality of groups of segments (STEP 2b) and summed, to provide an estimate of the resistance provided by each segment or any of the groups of segments of the first and the second resistance material (STEP 2).

In a next step, a thermal gradient generator, e.g., a resistive heater, that is thermally coupled to and proximate to the resistance network is energized to apply heat to the resistance network rapidly (STEP 3). The thermal gradient generator is structured and arranged to provide a local, linear or uniform thermal gradient to the first and the second resistance materials in the resistance network (STEP 3) without significantly changing the overall temperature of the substrate or die.

In one aspect of the present method, the thermal gradient generator is thermally coupled so that when the thermal gradient generator is energized with a 48V bias, the temperature of each of the plurality of first and second resistance member segments increases by about 50° C. to about 100° C. and the thermal time constant is less than about 100 µsec.

In a next step, the post-energizing output current can be measured or sampled (STEP 4). If there is no change in current between the pre- and post-energizing measurements, then the TCR is already zero or has been trimmed to zero and the operation is complete and the "done" position is achieved. However, if a variation or change in current is measured, sampled or detected, the "resistance mixture" of first and second resistance material segments in the resistance network is adjusted (STEP 5).

Variations in pre- and post-energizing current measurements can be adjusted using a mixture trim controller (STEP 5), e.g., a 4-bit controller such as for a current splitter, a current minor, and the like, to change to overall TCR of the resistance network. Changing the overall TCR of the resistance network is effected by changing the number of the first resistance material segments and the number of second resistance material segments actively participating in the resistance network.

In another aspect of the present method, adjustments are "look-ahead" adjustments that use real time temperature ($\Delta T$) and current variations to forecast or predict the optimal combination or "resistance mixture" of first and second resistance member segments that provide the lowest, i.e., zero or near zero, TCR.

Adjustment to the "resistance mixture" (STEP 5) continues until the TCR of the resistance network stabilizes. Once the TCR of the resistance network stabilizes, then the absolute (or overall) resistance value is adjusted (STEP 6). Absolute resistance trimming (STEP 6) proportionally adjusts the first and the second resistance member segments. Hence, the thickness variables can be changed without changing the temperature. As a result, the overall TCR remains unchanged. Moreover, temperature stability is limited by absolute resistance trimming and overall stability is less than about 1 percent.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus comprising:
    an adjustable voltage source;
    a voltage-to-current converter is coupled to the adjustable voltage source and that provides a reference current; and
    an adjustable impedance network that is coupled to the voltage-to-current converter, wherein the adjustable impedance network includes:
        a first set of resistors that are each formed of a first material in a substrate;
        a second set of resistors that are each formed of a second material in the substrate, wherein resistors from each of the first and second sets of resistors are arranged in a pattern in parallel to one another so as to reduce external thermal gradient effects; and
        a serpentine heater resistor that is formed over a portion of each of the resistors from the first and second sets.

2. The apparatus of claim 1, wherein the adjustable impedance network further comprises:
    a field oxide layer;
    a resistor body that includes the first and second sets of transistors formed over the field oxide layer;
    a first metallization layer formed over the resistor body, wherein the first metallization layer includes a Faraday shield;
    a second metallization layer that is formed over the first metallization layer, wherein the second metallization layer includes the serpentine heater; and
    a third metallization layer formed over the second metallization layer, wherein the third metallization layer includes a heat spreader.

3. The apparatus of claim 1, wherein the first set of resistors are each formed of high-sheet rho (HSR) polysilicon, and wherein the second set of resistors are each formed of medium-sheet rho (MSR) polysilicon.

4. The apparatus of claim 3, wherein the voltage-to-current converter further comprises:
    a first differential amplifier having a first input terminal, a second input terminal, and an output terminal, wherein the first input terminal of the first differential amplifier is coupled to the adjustable voltage source, and wherein the second input terminal of the first differential amplifier is coupled to the adjustable impedance network;
    a first transistor having a first passive electrode, a second passive electrode, and a control electrode, wherein the control electrode of the first transistor is coupled to the output terminal of the first differential amplifier, and wherein the first passive electrode of the first transistor provides the reference current, and wherein the second passive electrode of the first transistor is coupled to the second output terminal of the first differential amplifier;

a second differential amplifier having a first input terminal, a second input terminal, and an output terminal, wherein the first input terminal of the first differential amplifier is coupled to the adjustable voltage source, and wherein the second input terminal of the second differential amplifier is coupled to the adjustable impedance network; and a second transistor having a first passive electrode, a second passive electrode, and a control electrode, wherein the control electrode of the second transistor is coupled to the output terminal of the second differential amplifier, and wherein the first passive electrode of the second transistor is coupled to the first passive electrode of the first transistor, and wherein the second passive electrode of the second transistor is coupled to the second output terminal of the second differential amplifier.

5. The apparatus of claim 4, wherein the voltage-to-current converter further comprises a third transistor having a first passive electrode, a second passive electrode, and a control electrode, wherein the control electrode of the third transistor is coupled to the output terminal of the second differential amplifier, and wherein the second first electrode of the third transistor is coupled to the second input terminal of the second differential amplifier.

6. The apparatus of claim 1, wherein the impedance network further comprises:
a plurality of trim sets coupled in series with one another, wherein each trim set includes:
a first resistor from the first set of resistors;
a second resistor from second set of resistors, wherein the first and second resistors are coupled in series with one another;
a first trim transistor having a first passive electrode, a second passive electrode, and a control electrode, wherein the first and second passive electrodes of the first trim transistor are coupled to the first resistor, and wherein the control electrode of the first trim transistor receives at least one of a plurality of trim signals;
a second trim transistor having a first passive electrode, a second passive electrode, and a control electrode, wherein the first and second passive electrodes of the second trim transistor are coupled to the second resistor; and
an inverter that is coupled to the control electrode of the second trim transistor and that receive the at least one of a plurality of trim signals; and
a faraday shield that separates the serpentine heater resistor from the resistors of the plurality of trim sets.

7. An apparatus comprising:
an adjustable voltage source including:
a plurality of reference resistors that are coupled in series with one another; and
a plurality of reference transistors, wherein each reference transistor includes first and second passive electrodes that are coupled to at least one of the reference resistors, and wherein each reference transistor includes a control electrode that receives one of a plurality of reference signals;
a voltage-to-current converter is coupled to the adjustable voltage source and that provides a reference current; and
an adjustable impedance network that is coupled to the voltage-to-current converter, wherein the adjustable impedance network includes:
a first set of resistors that are each formed of a first material in a substrate;
a second set of resistors that are each formed of a second material in the substrate, wherein resistors from each of the first and second sets of resistors are arranged in a pattern in parallel to one another so as to reduce external thermal gradient effects; and
a serpentine heater resistor that is formed over a portion of each of the resistors from the first and second sets.

8. The apparatus of claim 7, wherein the adjustable impedance network further comprises:
a field oxide layer;
a resistor body that includes the first and second sets of transistors formed over the field oxide layer;
a first metallization layer formed over the resistor body, wherein the first metallization layer includes a Faraday shield;
a second metallization layer that is formed over the first metallization layer, wherein the second metallization layer includes the serpentine heater; and
a third metallization layer formed over the second metallization layer, wherein the third metallization layer includes a heat spreader.

9. The apparatus of claim 7, wherein the first set of resistors are each formed of HSR polysilicon, and wherein the second set of resistors are each formed of MSR polysilicon.

10. The apparatus of claim 9, wherein the voltage-to-current converter further comprises:
a first differential amplifier having a first input terminal, a second input terminal, and an output terminal, wherein the first input terminal of the first differential amplifier is coupled to the adjustable voltage source, and wherein the second input terminal of the first differential amplifier is coupled to the adjustable impedance network;
a first transistor having a first passive electrode, a second passive electrode, and a control electrode, wherein the control electrode of the first transistor is coupled to the output terminal of the first differential amplifier, and wherein the first passive electrode of the first transistor provides the reference current, and wherein the second passive electrode of the first transistor is coupled to the second output terminal of the first differential amplifier;
a second differential amplifier having a first input terminal, a second input terminal, and an output terminal, wherein the first input terminal of the first differential amplifier is coupled to the adjustable voltage source, and wherein the second input terminal of the second differential amplifier is coupled to the adjustable impedance network; and
a second transistor having a first passive electrode, a second passive electrode, and a control electrode, wherein the control electrode of the second transistor is coupled to the output terminal of the second differential amplifier, and wherein the first passive electrode of the second transistor is coupled to the first passive electrode of the first transistor, and wherein the second passive electrode of the second transistor is coupled to the second output terminal of the second differential amplifier.

11. The apparatus of claim 10, wherein the voltage-to-current converter further comprises a third transistor having a first passive electrode, a second passive electrode, and a control electrode, wherein the control electrode of the third transistor is coupled to the output terminal of the second differential amplifier, and wherein the second first electrode of the third transistor is coupled to the second input terminal of the second differential amplifier.

12. The apparatus of claim 7, wherein the impedance network further comprises:

a plurality of trim sets coupled in series with one another, wherein each trim set includes:
a first trim resistor from the first set of resistors;
a second trim resistor from second set of resistors, wherein the first and second resistors are coupled in series with one another;
a first trim transistor having a first passive electrode, a second passive electrode, and a control electrode, wherein the first and second passive electrodes of the first trim transistor are coupled to the first trim resistor, and wherein the control electrode of the first trim transistor receives at least one of a plurality of trim signals;
a second trim transistor having a first passive electrode, a second passive electrode, and a control electrode, wherein the first and second passive electrodes of the second trim transistor are coupled to the second trim resistor; and
an inverter that is coupled to the control electrode of the second trim transistor and that receive the at least one of a plurality of trim signals; and
a faraday shield that separates the serpentine heater resistor from the trim resistors of the plurality of trim sets.

13. An apparatus comprising:
an adjustable voltage source including:
  a plurality of reference resistors that are coupled in series with one another; and
  a plurality of NMOS reference transistors, wherein each NMOS reference transistor is coupled to at least one of the reference resistors at its source and drain and that receives one of a plurality of reference signals at its gate;
a voltage-to-current converter is coupled to the adjustable voltage source and that provides a reference current; and
an adjustable impedance network that is coupled to the voltage-to-current converter, wherein the adjustable impedance network includes:
  a field oxide layer;
  a first set of resistors that are each formed of HSR polysilicon within a resistor body that is formed over the field oxide layer;
  a second set of resistors that are each formed of MSR polysilicon within the resistor body, wherein resistors from each of the first and second sets of resistors are arranged in a pattern in parallel to one another so as to reduce external thermal gradient effects; and
  a first metallization layer formed over the resistor body, wherein the first metallization layer includes a Faraday shield;
  a serpentine heater resistor that is formed over a portion of each of the resistors from the first and second sets within a second metallization layer that is formed over the first metallization layer; and
  a third metallization layer formed over the second metallization layer, wherein the third metallization layer includes a heat spreader.

14. The apparatus of claim 13, wherein the voltage-to-current converter further comprises:
a first differential amplifier having a first input terminal, a second input terminal, and an output terminal, wherein the first input terminal of the first differential amplifier is coupled to the adjustable voltage source, and wherein the second input terminal of the first differential amplifier is coupled to the adjustable impedance network;
a first transistor having a first passive electrode, a second passive electrode, and a control electrode, wherein the control electrode of the first transistor is coupled to the output terminal of the first differential amplifier, and wherein the first passive electrode of the first transistor provides the reference current, and wherein the second passive electrode of the first transistor is coupled to the second output terminal of the first differential amplifier;
a second differential amplifier having a first input terminal, a second input terminal, and an output terminal, wherein the first input terminal of the first differential amplifier is coupled to the adjustable voltage source, and wherein the second input terminal of the second differential amplifier is coupled to the adjustable impedance network; and
a second transistor having a first passive electrode, a second passive electrode, and a control electrode, wherein the control electrode of the second transistor is coupled to the output terminal of the second differential amplifier, and wherein the first passive electrode of the second transistor is coupled to the first passive electrode of the first transistor, and wherein the second passive electrode of the second transistor is coupled to the second output terminal of the second differential amplifier.

15. The apparatus of claim 14, wherein the voltage-to-current converter further comprises a third transistor having a first passive electrode, a second passive electrode, and a control electrode, wherein the control electrode of the third transistor is coupled to the output terminal of the second differential amplifier, and wherein the second first electrode of the third transistor is coupled to the second input terminal of the second differential amplifier.

16. The apparatus of claim 13, wherein the impedance network further comprises a plurality of trim sets coupled in series with one another, wherein each trim set includes:
a first trim resistor from the first set of resistors;
a second trim resistor from second set of resistors, wherein the first and second resistors are coupled in series with one another;
a first NMOS trim transistor that is coupled to the first trim resistor at its source and drain and that receives at least one of a plurality of trim signals at its gate;
a second NMOS trim transistor that is coupled to the second trim resistor at its source and drain; and
an inverter that is coupled to the gate of the second NMOS trim transistor and that receive the at least one of a plurality of trim signals.

* * * * *